United States Patent [19]

Kawai

[11] Patent Number: 4,751,577

[45] Date of Patent: Jun. 14, 1988

[54] GAIN CONTROL CIRCUIT

[75] Inventor: Ryuichiro Kawai, Kanagawa, Japan

[73] Assignee: Sony Corporation, Tokyo, Japan

[21] Appl. No.: 74,937

[22] Filed: Jul. 17, 1987

[30] Foreign Application Priority Data

Jul. 19, 1986 [JP] Japan ................................. 61-170330

[51] Int. Cl.$^4$ ............................................. H04N 5/52
[52] U.S. Cl. .................................... 358/174; 358/169
[58] Field of Search ................ 358/174, 169, 172, 178

[56] References Cited

U.S. PATENT DOCUMENTS

| 4,204,229 | 5/1980 | Heuze | 358/174 X |
| 4,318,129 | 3/1982 | Zwirn | 358/174 |
| 4,378,569 | 3/1983 | Dallas, Jr. et al. | 358/174 X |
| 4,470,067 | 9/1984 | Mino | 358/174 |

FOREIGN PATENT DOCUMENTS

| 2834886 | 2/1979 | Fed. Rep. of Germany | 358/174 |
| 57-173284 | 10/1982 | Japan | 358/174 |

Primary Examiner—James J. Groody
Assistant Examiner—E. Anne Faris
Attorney, Agent, or Firm—Lewis H. Eslinger

[57] ABSTRACT

A gain control circuit includes first and second clamping circuits each of which has a DC shift circuit and a comparator comprising the output of the DC shift circuit with a reference voltage and providing a feedback signal to the respective shift circuit. A peak detector is responsive to the output of the second clamping circuit and is connected with a comparator which outputs a gain control signal to a variable gain device or amplifier located between the clamp circuits and also to the comparators associated with the DC shift circuits for varying the follow-up speeds of the clamping circuits.

15 Claims, 3 Drawing Sheets

GAIN CONTROL CIRCUIT

BACKGROUND OF THE INVENTION

1. Field of the Invention

This invention relates generally to a gain control circuit, and more specifically is directed to a gain control circuit suitable for achieving contrast control in the reproduction of video images in television receivers, video tape recorders (VTRs) and the like.

2. Description of the Prior Art

In order to reduce the fluctuations in the contrast of reproduced video images resulting from variations in signal strength, receiver sensitivity, phasing, and the like, for example, in television receivers and VTRs, it is known to employ a gain control circuit including first and second clamping circuits, a variable gain amplifier interposed between the clamping circuits, a peak detector sensing peaks in the output of the second clamping circuit, and a comparator which compares the peak detector output with a predetermined voltage to provide therefrom a gain control signal applied to the variable gain amplifier. It is intended that the first clamping circuit be effective to clamp the pedestal level of the video signal at a reference level before effecting gain control, while the second clamping circuit is intended to achieve a similar clamping action after gain control is effected.

However, in the above described gain control circuit according to the prior art, the clamping circuits have fixed follow-up speeds so that, if such follow-up speed is even a little too high, noise superimposed on the input video signal or noise generated within the variable gain amplifier causes variations in the direct current level of the output video signal and consequent deterioration of the quality of the reproduced image. On the other hand, if the fixed follow-up speed of the clamping circuits is reduced in an attempt to overcome the above described problem, the image contrast changes with changes in the level of the received electromagnetic or video signal, and the effectiveness of the automatic gain control (AGC) function is reduced or even lost. In other words, if the clamping circuits have a fixed follow-up speed, such fixed follow-up speed will be either too high or too low in relation to the changing level of the input video signal.

OBJECTS AND SUMMARY OF THE INVENTION

Accordingly, it is a object of this invention to provide a gain control circuit which avoids the above mentioned problems encountered in the prior art.

More specifically, it is an object of this invention to provide a gain control circuit including a variable gain amplifier associated with at least one clamping circuit, and in which the follow-up speed of each clamping circuit is varied in response to a signal which controls the amplifier gain.

In accordance with an aspect of this invention, a gain control circuit comprises signal input and output means, variable gain means, such as, a variable gain amplifier, clamping circuit means operatively connected with the variable gain amplifier between the signal input and output means and having a variable follow-up speed, and means for generating a gain control signal which is supplied to the variable gain means for controlling the gain provided by the latter and to the clamping circuit means for varying the follow-up speed thereof.

In a preferred embodiment of the invention, the variable gain amplifier is interposed between first and second clamping circuits each of which has a DC shift circuit and a comparator which compares the output of the respective DC shift circuit with a reference voltage and provides a comparison signal fed back, as a shift control signal, to the respective DC shift circuit.

In accordance with another feature of this invention, the means for generating a gain control signal includes a peak detector responsive to the output of the second clamping circuit to provide a detected output to a comparator for comparison with a predetermined voltage, with the resulting comparator output constituting the gain control signal supplied to the variable gain amplifier, and also supplied to the clamping circuits for controlling the follow-up speeds thereof.

The above, and other objects, features and advantages of the invention, will be apparent from the following detailed description when read in connection with the accompanying drawings in which corresponding parts and components are identified by the same reference numerals in the several views.

DESCRIPTION OF THE PREFERRED EMBODIMENTS

Figure 1:
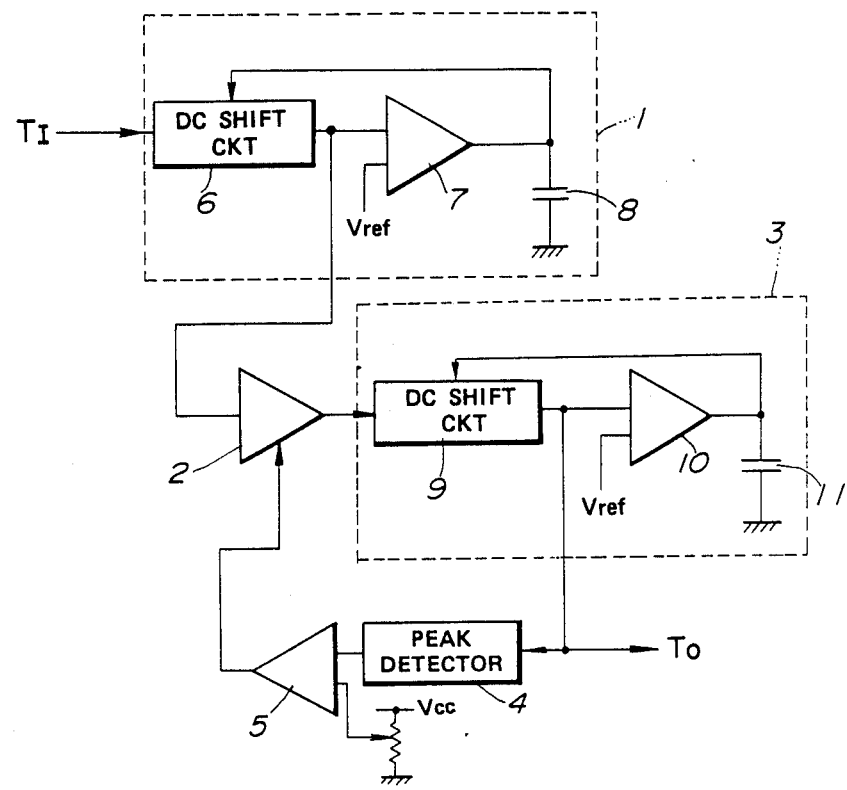
FIG. 1 is a block diagram showing a gain control circuit according to the prior art.

In order that the problems solved by the present invention may be fully understood, a gain control circuit according to the prior art, and which is burdened by those problems, will initially be described with reference to FIG. 1. Such gain control circuit is particularly adapted for reducing the fluctuations in the contrast of reproduced video images resulting from variations in signal strength, receiver sensitivity and phasing, for example, in television receivers, VTRs and the like. The illustrated gain control circuit according to the prior art is shown to include a first clamping circuit 1, a variable gain amplifier 2 and a second clamping circuit 3 connected in succession between an input terminal $T_I$, which receives an input video signal, and an output terminal $T_O$, at which an output video signal may be derived. The gain control circuit according to the prior art further includes a peak detector 4 which receives the output of the second clamping circuit 3, and a comparator 5 which compares the detected output from peak detector 4 with a predetermined voltage and provides a corresponding gain control signal applied to the variable gain amplifier 2 for controlling the gain of the latter.

The first clamping circuit 1 is shown to include a DC shift circuit 6 which receives the input video signal from the terminal $T_I$ and supplies its DC shifted output to the variable gain amplifier 2 and to one input of a comparator 7 which, at its other input, receives a reference voltage $V_{ref}$ representing the desired DC level of the video signal, for example, at is pedestal interval. The output of comparator 7 is applied to one electrode of a capacitor 8 acting as a memory or storage element and having its other electrode connected to ground, and the output of comparator 7 is further applied as a feed-back or shift control signal to the DC shift circuit 6.

The clamping circuit 3 is shown to similarly include a DC shift circuit 9 which receives the output of the variable gain amplifier 2, a comparator 10 which compares the output of the DC shift circuit 9 with a reference voltage $V_{ref}$, and a capacitor 11 connected, at one electrode, to ground, and at its other electrode, to the output of comparator 10 which provides a feed-back or shift control signal to the respective DC shift circuit 9. Further, the output of DC shift circuit 9 is connected to the peak detector 4 and to terminal $T_O$ for providing the output video signal at such terminal.

It will be appreciated that, whenever the peak value detected by detector 4 exceeds the predetermined value, for example, established by a voltage source $V_{cc}$ and a variable resistor $R_O$, comparator 5 provides a corresponding gain control signal to amplifier 2 for correspondingly reducing the gain thereof. In clamping circuits 1 and 3, the outputs of the DC shift circuits 6 and 9 are compared in comparators 7 and 10 with the respective reference voltages $V_{ref}$. When the outputs of the shift circuits 6 and 9 exceed the respective reference voltage levels during pedestal intervals of the video signal, comparators 7 and 10 provide outputs by which the respective capacitors 8 and 11 are charged. On the other hand, when the outputs of DC shift circuits 6 and 9 fall below the respective reference levels $V_{ref}$ during the pedestal intervals, comparators 7 and 10 permit discharging of capacitors 8 and 11, respectively, with the voltages appearing on capacitors 8 and 11 being applied to the DC shift circuits 6 and 9, respectively, as feed-back or shift control signals therefor.

In each of the clamping circuits 1 and 3, the comparator 7 and 10 is made operative by a gate or clamping pulse (FIG. 2B) which is shown to be a low level pulse and is made to occur during each pedestal interval of the video signal received from the DC shift circuit 6 or 9, respectively. In each instance, the pedestal level of the video signal is controlled in response to the feedback signal to the DC shift circuit 6 or 9 so as to be made equal to the reference level $V_{ref}$ applied to the comparator 7 or 10. More specifically, with the gain control circuit according to the prior art, as illustrated in FIG. 1, the pedestal level of the video signal is clamped at the reference level by the first clamping circuit 1 prior to effecting gain control in the variable gain amplifier 2, and a similar clamping effect is achieved by the second clamping circuit 3 after gain control has been effected. The purpose of the foregoing is to maintain a substantially constant DC level of the video signal.

However, the described gain control circuit according to the prior art suffers from the disadvantage that the clamping circuits 1 and 3 thereof have fixed follow-up speeds. If such fixed follow-up speed of the clamping circuits is a little too high, noise superimposed on the input video signal and/or noise generated within the variable gain amplifier 2 causes variation of the DC level of the output video signal with the result that the quality of the reproduced image is deteriorated.

Figure 2A:
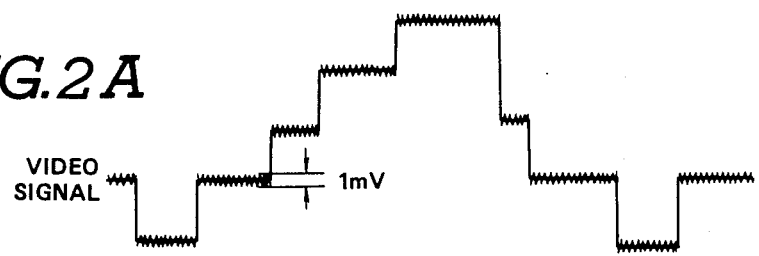
FIGS. 2A and 2B are timing charts to which reference will be made in explaining a problem encountered with the gain control circuit of FIG. 1.
Figure 2B:

More specifically, if it is assumed that the input video signal applied to terminal $T_I$ has a noise level of 1 mV, as is normal and is represented on FIG. 2A, and that the fixed follow-up speed of clamping circuit 1 is too high, then, during the sampling of the output of the comparator 7 in response to the gate or clamping pulse shown on FIG. 2B, the level of the output of comparator 7 will change in accordance with such noise. Since the noise tends to be random, the level of the output of comparator 7 at the termination of the gate pulse, and which determines the feed-back or shift control signal supplied from capacitor 8 to DC shift circuit 6 and hence the DC level at which the video signal is clamped, may vary from one sampling or clamping period to the next. Therefore, the DC level of the video signal applied from clamping circuit 1 to amplifier 2 will fluctuate in accordance with the noise. Of course, the variable gain amplifier 2 amplifies such fluctuation of DC level of the video signal.

If the fixed follow-up speed of the first clamping circuit 1 is reduced, as has been proposed for avoiding the above described problem in the gain control circuit according to the prior art, the image contrast of the reproduced image changes in response to variations in the strength or level of the received electromagnetic or video signal and the effectiveness of the AGC function is reduced or lost. In other words, when the clamping circuits 1 and 3 have fixed follow-up speeds, as in the gain control circuit according to the prior art, such fixed follow-up speeds will be either undesirably high when the level of the incoming signal is very high, or too low when the level of the incoming video signal is low. Thus, permanently maintaining the follow-up speeds of the clamping circuits at fixed values will inherently cause fluctuation of the relation of such follow-up speeds to the changing levels of the input signal.

Figure 3:
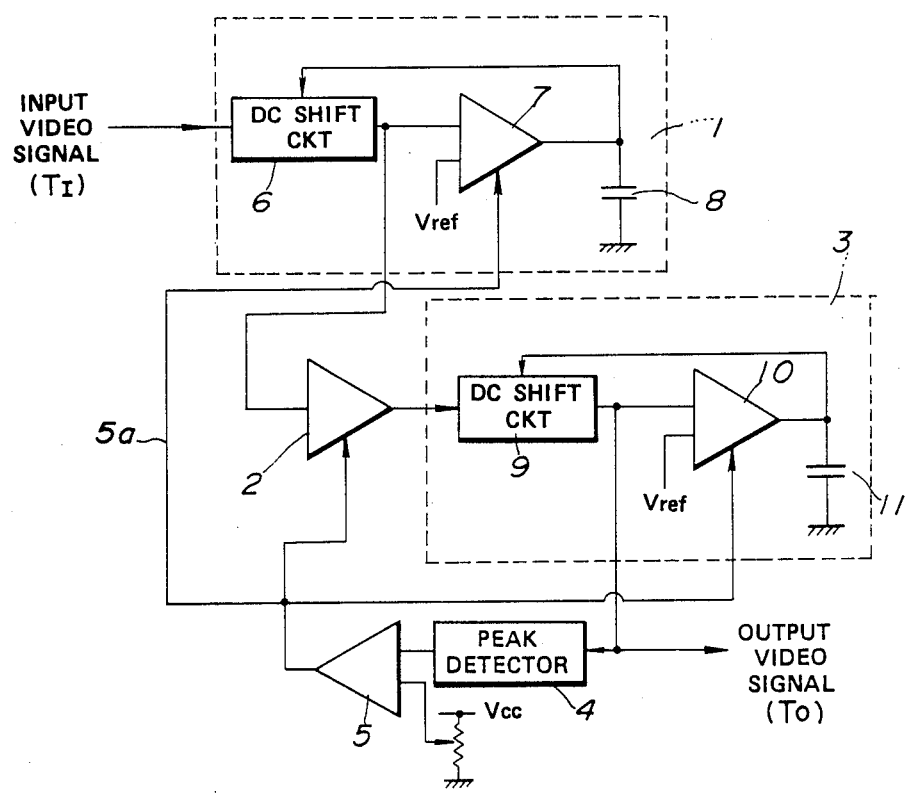
FIG. 3 is a block diagram showing a gain control circuit according to an embodiment of the present invention.

Referring now to FIG. 3, it will be seen that a gain control circuit according to an embodiment of the present invention is there illustrated to be generally similar to the gain control circuit previously described with reference to FIG. 1 and has its corresponding parts identified by the same reference numerals. The gain control circuit of FIG. 3 differs from the gain control circuit according to the prior art only in that the output of comparator 5 which is applied to variable gain amplifier 2 as a gain control signal, is also applied, as a follow-up characteristic control signal, to the comparator 7 of clamping circuit 1 and to the comparator 10 of clamping circuit 3, as at 5a and 5b, respectively. With such arrangement according to the present invention, when the input power to the variable gain amplifier 2 rises substantially, such as, when the level of the received or input video signal is high, the output of comparator 5 is effective in amplifier 2 to reduce the gain thereof and, simultaneously, the output of comparator 5 is effective through the connections 5a and 5b to comparators 7 and 10 to increase the follow-up speeds of clamping circuits 1 and 3. Conversely, when the level or strength of the received or input video signal is low, the output of comparator 5 is effective, in amplifier 2, to increase the gain thereof and, in clamping circuits 1 and 3, to decrease the follow-up speeds of the clamping circuits.

Figure 4A:
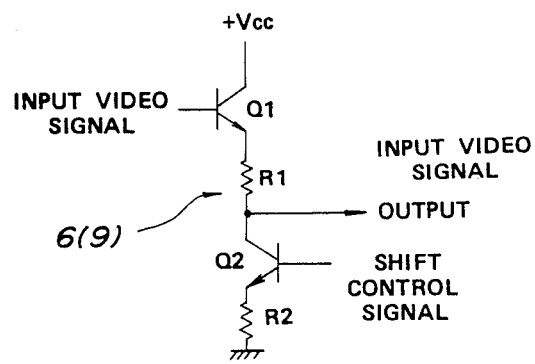
FIGS. 4A and 4B are circuit diagrams illustrating alternative DC shift circuits that may be employed in clamping circuits included in the gain control circuit of FIG. 3.

As shown in FIG. 4A, each of the DC shift circuits 6 and 9 included in the clamping circuits 1 and 3 may include an NPN-type transistor $Q_1$ which receives, at its base, the video signal input to the respective clamping circuit, and which has its collector connected to a power input source $+V_{cc}$. The emitter of transistor $Q_1$ is shown to be connected through a resistor $R_1$ to the collector of an NPN-type transistor $Q_2$ which, at its base, receives the shift control signal from the output of the respective comparator 7 or 10. The emitter of transistor $Q_2$ is connected to ground through a resistor $R_2$, and the output of the illustrated DC shift circuit is shown to be derived at a junction between the collector of the transistor $Q_2$ and the resistor $R_1$.

When the level of the shift control signal, that is, the charge on the capacitor 8 or 11 fed back to the base of the transistor $Q_2$ in the DC shift circuit 6 or 9, falls to "0", the DC level of the video signal at the output of circuit 6 or 9 is not reduced, that is, it remains substantially unchanged, since the change in voltage between the base and emitter of the transistor is substantially negligible. On the other hand, an increase in the level of the shift control signal fed back to the base of transistor $Q_2$ in response an increase in the level of the video signal applied to the comparator 7 or 10 relative to the reference voltage $V_{ref}$ causes an increase in the current flow through the transistor $Q_2$ and also through the resistor $R_1$. Such increased current flow through the resistor $R_1$ causes an increase in the voltage drop across the resistor $R_1$ and, as a result thereof, the DC level of the video signal derived at the junction between the resistor $R_1$ and the collector of transistor $Q_2$ is decreased.

Figure 4B:
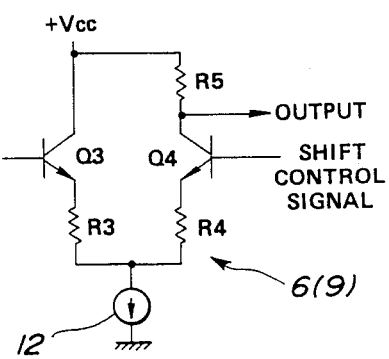

Referring now to FIG. 4B, it will be seen that, in accordance with another embodiment of the invention, each of the DC shift circuits 6 and 9 included in the clamping circuits 1 and 3, respectively, of the circuit arrangement shown in FIG. 3 may comprise an NPN-type transistor $Q_3$ which receives the input video signal at its base, and which has its collector connected to a power input source $+V_{cc}$ while the emitter of the transistor $Q_3$ is connected through a resistor $R_3$ to a voltage stabilizer circuit 12 having an output connected to ground. An NPN-type transistor $Q_4$ has its emitter connected through a resistor $R_4$ to a junction between the resistor $R_3$ and the voltage stabilizer circuit 12, and the collector of transistor $Q_4$ is connected through a resistor $R_5$ to the power input source $+V_{cc}$. In the DC shift circuit of FIG. 4B, the output is derived from a junction between the collector of transistor $Q_4$ and the resistor $R_5$, and the shift control signal fed back from the memory capacitor 8 or 11 associated with the comparator 7 or 10, respectively, is applied to the base of the transistor $Q_4$. When the level of the shift control signal applied to the base of transistor $Q_4$ is increased, the flow of current through transistor $Q_4$ is correspondingly increased, and the DC level of the video signal derived at the junction between the resistor $R_5$ and the collector of transistor $Q_4$ is reduced by an amount equivalent to the increase in current flow through the transistor $Q_4$ multiplied by the resistance value of the resistor $R_5$. Conversely, when the level of the shift control signal applied to the base of transistor $Q_4$ is decreased, the DC level of the video signal output from the DC shift circuit 6 or 9 is increased.

Figures 5A, 5B:
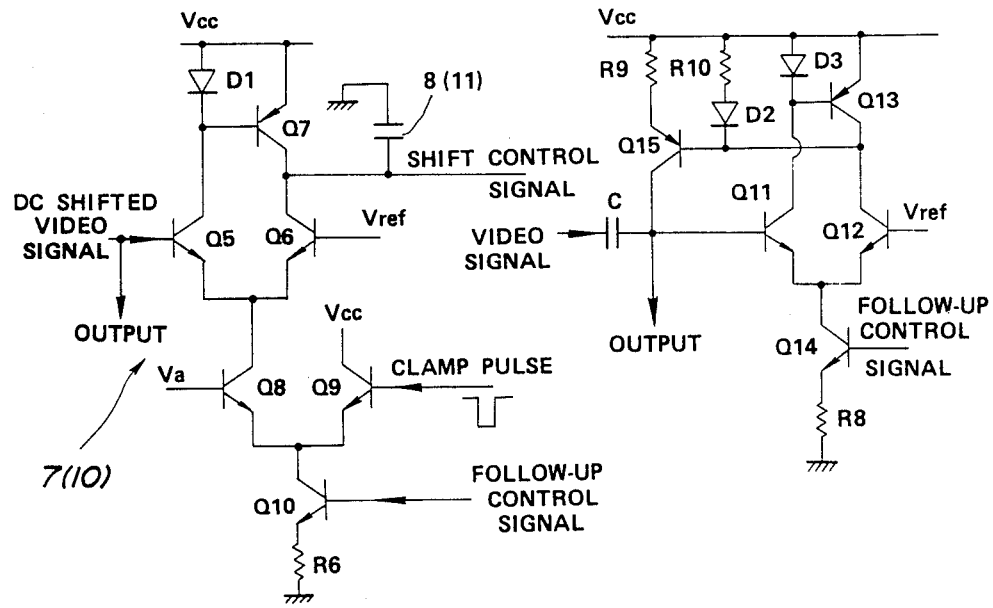
FIGS. 5A and 5B are circuit diagrams showing alternative comparators that can be used in the clamping circuits of FIG. 3.

Referring now to FIG. 5A, it will be seen that each of the comparators 7 and 10 in the clamping circuits 1 and 3, respectively, of the gain control circuit embodying this invention may be of a synchronous type comprising an NPN-type transistor $Q_5$ which, at its base, receives the output video signal from the DC shift circuit 6 or 9. The collector of transistor $Q_5$ is connected to the cathode of a diode $D_1$ which has its anode connected to the power input source $+V_{cc}$. The emitter of transistor $Q_5$ is connected to the emitter of an NPN-type transistor $Q_6$ which, at its base, receives the reference voltage $V_{ref}$. The collector of transistor $Q_6$ is connected to the collector of a PNP-type transistor $Q_7$ which has its emitter connected to the power input source $+V_{cc}$, while the base of transistor $Q_7$ is connected to a junction between the diode D, and the collector of transistor $Q_5$. The memory capacitor 8 or 11 of the respective clamping circuit 1 or 3 is connected between the collector of transistor $Q_7$ and ground, and the output or shift control signal from the comparator 7 or 10 is derived from the electrode of the cpacitor 8 or 11 connected to the junction between the collectors of transistors $Q_6$ and $Q_7$. The connected together emitters of transistors $Q_5$ and $Q_6$ are connected to the collector of an NPN-type transistor $Q_8$ which has its base connected to a source of a predetermined potential $V_a$. The emitters of transistor $Q_8$ and of an NPN transistor $Q_9$ are connected in common to the collector of an NPN-type transistor $Q_{10}$ which has its emitter connected through a resistor $R_6$ to ground. The base of the transistor $Q_{10}$ receives the follow-up characteristic or speed control signal, that is, the gain control signal from the output of the comparator 5, and the transistor $Q_9$ has its collector connected to the power input source $+V_{cc}$ and its base connected to receive the gate or clamp pulse signal (FIG. 2B). As shown, such gate or clamp pulse signal is normally maintained at a relatively high level, and is changed-over to its low level during the period when the difference between the level of the video signal from the DC shift circuit 6 or 9 and the reference voltage $V_{ref}$ is to be sampled, for example, only during the pedestal interval of the video signal.

In the circuit described above with reference to FIG. 5A, the transistor $Q_8$ is turned ON or rendered conductive only during each sampling period, that is, when the gate or clamp pulse is at a low level during the pedestal interval of the video signal. If the pedestal level of the video signal is higher than the reference voltage or level $V_{ref}$, the transistor $Q_5$ will transmit a larger current than the transistor $Q_6$ at the time when the transistor $Q_8$ is turned ON. The current which flows through transistor $Q_7$ is larger than the current which flows through the transistor $Q_5$ and hence greater than the current flowing through the transistor $Q_6$ with the result that the current flowing through the transistor $Q_7$ flows, in part, to the memory capacitor 8 or 11 for charging the latter. When the gate or clamp pulse applied to the base of the transistor $Q_9$ returns to its normal high level, the transistor $Q_8$ is rendered non-conductive or turned OFF, with the result that the charge on the memory capacitor 8 or 11 is held thereby until the beginning of the next sampling period. Such charge on the memory capacitor 8 or 11 is fed back as the shift control signal to the associated DC shift circuit 6 or 9 with the result that the DC level of the video signal is reduced when the sampled pedestal level is higher than the reference level $V_{ref}$.

On the other hand, when the sampled pedestal level of the video signal is lower than the reference level or voltage $V_{ref}$, the current flow through the transistor $Q_5$ during the sampling period is lower than the current flow through the transistor $Q_6$, and the current flow through the transistor $Q_7$ is also less than the current flow through the transistor $Q_6$. Therefore, the current flowing through the transistor $Q_6$ includes current flowing from the memory capacitor 8 or 11 which is thereby discharged with the result that the level of the shift control signal applied to the respective DC shift circuit 6 or 9 is lowered and, in response thereto, the shift control circuit increases the DC level of the video signal.

However, it will be apparent from FIG. 5A that the total current flow through the transistors $Q_5$ and $Q_6$ is determined by the level of the follow-up control signal applied to the base of the transistor $Q_{10}$ from the output of the comparator 5. Accordingly, the total current flow through transistors $Q_5$ and $Q_6$ increases and decreases in accordance with increasing and decreasing, respectively, of the level of the follow-up control signal from the output of the comparator 5. The clamping control of the comparator 7 or 10, that is, its follow-up speed, is therefore controlled by the follow-up control signal from the comparator 5.

Referring now to FIG. 5B, it will be seen that the present invention may also be embodied in a gain control circuit which employs clamping circuits of the asynchronous type. One such clamping circuit of the asynchronous type is shown on FIG. 5B to include an NPN-type transistor $Q_{11}$ which receives the video signal, at its base, by way of a capacitor C. The collector of the transistor $Q_{11}$ is connected to the cathode of a diode $D_3$ which has its anode connected to a power input source $+V_{cc}$. The emitter of the transistor $Q_{11}$ is connected with the emitter of an NPN-type transistor $Q_{12}$ which receives the reference level or voltage $V_{ref}$ at its base, and which has its collector connected to the collector of a PNP-type transistor $Q_{13}$. The emitter of the transistor $Q_{13}$ is connected to the power input source $+V_{cc}$, and the base of transistor $Q_{13}$ is connected to a junction between the diode $D_3$ and the collector of transistor $Q_{11}$. The collector of an NPN-type transistor $Q_{14}$ is connected to the connected-together emitters of the transistors $Q_{11}$ and $Q_{12}$. The base of the transistor $Q_{14}$ receives the follow-up control signal, for example, from the comparator 5 on FIG. 3, and the emitter of transistor $Q_{14}$ is connected to ground through a resistor $R_8$. The base of a PNP-type transistor $Q_{15}$ is connected to a junction between the collectors of the transistors $Q_{12}$ and $Q_{13}$, and also to the cathode of a diode $D_2$ which has its anode connected to the power input source $+V_{cc}$ through a resistor $R_{10}$.

The emitter of the transistor $Q_{15}$ is connected to the power input source $+V_{cc}$ through a resistor $R_9$ and the collector of transistor $Q_{15}$ is connected to a junction between the condensor C and the base of the transistor $Q_{11}$. Finally, in the clamping circuit of FIG. 5B, the shift control signal for an associated DC shift circuit (not shown) is derived from the junction between the capacitor C and the base of transistor $Q_{11}$.

In the operation of the clamping circuit described above with reference to FIG. 5B, the reference level or voltage $V_{ref}$ is made to correspond with the desired lowest level of the video signal, that is, with its synchronizing signal level. The input video signal applied through the capacitor C to the base of transistor $Q_{11}$ is compared with the reference level or voltage $V_{ref}$ applied to the base of the transistor $Q_{12}$. In the event that the input video signal, and more particularly the synchronizing signal portion thereof, has a voltage or level lower than that of the reference voltage $V_{ref}$, transistor $Q_{12}$ is turned ON with the result that transistor $Q_{15}$ is turned on and the capacitor C is charged, and the DC level of the video signal is shifted. Therefore this case uses the capacitor C as a memory capacitor and the DC level shift means. In this case, the total current flow through transistors $Q_{11}$ and $Q_{12}$ is determined by the follow-up control signal applied to transistor $Q_{14}$ from the comparator 5 on FIG. 3. Thus, when the level of the follow-up control signal increases, the total current flow through transistors $Q_{11}$ and $Q_{12}$ is increased for increasing the follow-up or clamping speed of the clamping circuit.

Figure 6:
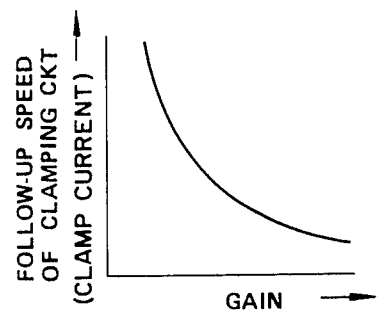
FIG. 6 is a graph illustrating, in terms of clamping power and gain, the characteristics of a follow-up speed control signal produced according to the present invention.

When the described embodiments of the invention are arranged so as to provide the relationship between the gain and the follow-up speed of the clamping circuit (or clamp current) shown on FIG. 6, particularly good results are achieved. However, substantial advantages are attained in gain control circuits according to the present invention even when the relation of the gain to the follow-up speed of the clamping circuits is not varied in accordance with the relationship indicated on FIG. 6.

Having described a number of preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A gain control circuit comprising: signal input means; signal output means; variable gain means; clamping circuit means operatively connected with said variable gain means between said signal input and output means and having a variable follow-up speed; and means for generating a gain control signal and supplying the same to said variable gain means for controlling the gain provided by the latter and to said clamping circuit means for varying said follow-up speed.

2. A gain control circuit as in claim 1; wherein said clamping circuit means includes means for increasing and decreasing said follow-up speed in response to said gain control signal being effective in said variable gain means for decreasing and increasing, respectively, said gain thereof.

3. A gain control circuit as in claim 1; wherein said clamping circuit means induces a follow-up speed of the clamping circuit which is approximately inversely proportional to the magnitude of said gain.

4. A gain control circuit as in claim 1; wherein said means for generating said gain control signal is feedback controlled.

5. A gain control circuit as in claim 4; wherein said means for generating said gain control signal includes peak detecting means connected with said signal output means for providing a detected output, and comparator means for providing said gain control signal in correspondence to a comparison of said detected output with a predetermined voltage.

6. A gain control circuit as in claim 1; wherein said clamping circuit means includes at least a first clamping circuit arranged prior to said variable gain means.

7. A gain control circuit as in claim 6; wherein said clamping circuit means further includes a second clamping circuit arranged after said variable gain means.

8. A gain control circuit as in claim 1; wherein said clamping circuit means includes a clamping circuit arranged after said variable gain means.

9. A gain control circuit as in claim 1; wherein said signal input means receives a video signal; and wherein said clamping circuit means includes DC shift circuit means for varying the DC level of the video signal, comparator means for comparing a level of the video signal issuing from said DC shift circuit means with a reference voltage level and providing a comparison output, capacitive means for storing said comparison output and providing therefrom a shift control signal fed back to said DC shift circuit means for determining said DC level of the video signal, and means responsive to said gain control signal for determining said follow-up speed as the speed with which said comparator means responds to changes in said level of the video signal issuing from said DC shift circuit means.

10. A gain control circuit as in claim 9; wherein said DC shift circuit means includes first and second transistors, said first transistor having a base arranged to receive an input video signal, a collector connected with a source of power and an emitter connected to a collector of said second transistor through a first resistor, said second transistor having a base arranged to receive said shift control signal and an emitter which is connected to ground through a second resistor, and an output connected to a junction between said first resistor and the collector of said second transistor.

11. A gain control circuit as in claim 9; wherein said DC shift circuit means includes first and second transistors, voltage stabilizer means, said first transistor having a base which receives an input video signal, a collector connected with a source of power and an emitter connected to ground through a first resistor and said voltage stabilizer means, said second transistor having a base which receives said shift control signal, an emitter connected with said voltage stabilizer means through a second resistor, and a collector connected to said source of power through a third resistor, and an output connected to a junction between said third resistor and the collector of said second transistor.

12. A gain control circuit as in claim 9; wherein said comparator means includes a first transistor having a base receiving said video signal issuing from said DC shift circuit means, a collector and an emitter; a source of power; a diode through which said collector is connected to said source of power; a second transistor having a base receiving said reference voltage level, an emitter connected with said emitter of the first transistor and a collector; a third transistor having a base connected to a junction between said diode and said collector of the first transistor, a collector connected to said collector of the second transistor and an emitter connected to said source of power; a fourth transistor having a base receiving a predetermined voltage, a collector connected to the connected-together emitters of said first and second transistors and an emitter; a fifth transistor having an emitter connected to the emitter of said fourth transistor, a collector connected to said source of power and a base receiving a clamp pulse; and a sixth transistor having a collector connected to the connected-together emitters of said fourth and fifth transistors, an emitter connected through a resistor to ground and a base receiving said gain control signal so that said sixth transistor constitutes said means for determining said follow-up speed; and wherein said capacitive means is connected to a junction between said collectors of the second and third transistors and at which said shift control signal is derived.

13. A gain control circuit as in claim 12; wherein said reference voltage level is a desired pedestal level for said video signal, and said clamp pulse is timed to render said fourth transistor conductive during each pedestal interval of the video signal.

14. A gain control circuit as in claim 9; wherein said comparator means includes a first transistor having a base connected through said capacitive means with the video signal issuing from the latter, a collector and an emitter; a source of power; a first diode through which said collector is connected to said source of power; a second transistor having a base receiving said reference voltage level, an emitter connected to said emitter of the first transistor and a collector; a third transistor having a collector connected to said collector of the second transistor, an emitter connected to said source of power and a base connected to a junction between said first diode and said collector of the first transistor; a fourth transistor having a collector connected to the connected-together emitters of said first and second transistors, an emitter connected through a first resistor to ground, and a base receiving said gain control signal so that said fourth transistor constitutes said means for determining said follow-up speed; a fifth transistor having an emitter connected to said source of power through a second resistor, a collector conneted to a junction located between said capacitive means and said base of the first transistor and at which an output signal is derived, and a base connected to a junction between said collectors of said second and third transistors; and a second diode connected with a third resistor between said base of the fifth resistor and said source of power.

15. A gain control circuit as in claim 14; wherein said reference voltage level is the desired synchronizing level of said video signal.

* * * * *